(12) United States Patent
Chemin

(10) Patent No.: US 6,520,780 B2
(45) Date of Patent: Feb. 18, 2003

(54) POWER RELAY MODULE

(75) Inventor: Gilles Chemin, Araches (FR)

(73) Assignee: Siemens Automotive S.A., Toulouse (FR)

( * ) Notice: Subject to any disclaimer, the term of this patent is extended or adjusted under 35 U.S.C. 154(b) by 0 days.

(21) Appl. No.: 09/836,431

(22) Filed: Apr. 18, 2001

(65) Prior Publication Data

US 2001/0034144 A1 Oct. 25, 2001

(30) Foreign Application Priority Data

Apr. 19, 2000 (FR) .............................. 0005040

(51) Int. Cl.$^7$ ........................... H01R 12/00; H05K 1/00
(52) U.S. Cl. ...................... 439/76.2; 361/824; 439/929
(58) Field of Search .............................. 439/76.2, 76.1, 439/929, 736; 361/826, 775, 823, 824, 728, 736, 819, 820, 837, 807, 808, 811

(56) References Cited

U.S. PATENT DOCUMENTS

| 4,703,397 A | * | 10/1987 | Minoura et al. ............ 361/428 |
| 4,850,884 A | | 7/1989 | Sawai et al. .................. 439/76 |
| 4,869,675 A | | 9/1989 | Ogawa ........................ 439/76 |
| 5,699,233 A | * | 12/1997 | Zlamal ...................... 439/76.2 |
| 5,764,487 A | | 6/1998 | Natsume ..................... 361/775 |
| 5,877,944 A | * | 3/1999 | Onizuka ..................... 361/826 |
| 6,368,119 B2 | * | 4/2002 | Murakami ................. 439/76.2 |

FOREIGN PATENT DOCUMENTS

| EP | 0 793 249 | 9/1997 |
| EP | 0 936 847 | 8/1999 |

* cited by examiner

Primary Examiner—Javaid Nasri
(74) Attorney, Agent, or Firm—Young & Thompson

(57) ABSTRACT

A power relay module includes a thick support having receiving portion for the pins of fuses, relays and a battery connector, internal lead ways suitable for the passage of current of predetermined intensity, and a circuit board supporting the control electronics of the relays, the support being disposed facing the circuit board, and having at lest two zones bearing on the board.

8 Claims, 1 Drawing Sheet

POWER RELAY MODULE

BACKGROUND OF THE INVENTION

The invention is in the field of electrical conductors. It relates particularly to conductors adapted to receive relays and fuses, and in general elements through which pass high intensity currents.

Still more particularly, the conductors according to the invention find their application in the automotive field, as power relay modules for computers. In this case, problems arise as to the heat limit of the strength of the solder of said relays on a printed circuit board forming a support, when substantial power or more is passed through the relays and hence through the solder. It is thus clear that the strength of the solder is a question of safety of the vehicle which must be ensured.

DESCRIPTION OF THE RELATED ART

Conventionally, the present solutions are grouped in several families. On the one hand, there are known soldered relays, for example in the case of fuse relay boxes, with the use of conductive ways that are made locally thicker on a circuit board, along the path of ways that must carry current of high intensity. These lead ways thus permit the circulation of greater current without giving rise to exaggerated thermal heating. The current thus passes from the current supply cable of the battery, to the fuse, then to the relay and to an outlet connector, passing each time through lead ways. All the lead ways are gathered on a printed circuit board which also serves as a mechanical support for the fuses and relays.

Similarly, there has been envisaged the use of a circuit board with two layers of copper permitting, by the same principle, accommodating a higher current intensity.

A second family of solutions uses interfitted relays (commonly called "clips"). In this case, the connector takes the form of a thick element, for example molded, comprising means for receiving electrical pins, on which the relays and fuses are received, and internal conductors, substantially dimensioned to permit the passage of high current without excessive heating. The power current flows within the support from the battery connector, toward the fuses, then toward the relays and the outlet connector.

Apart from the relay pins through which the power passes, the control pins, through which a substantially lower current passes, are connected to the control connectors or the relays by conductors of normal cross section.

In still another conventional solution, the high current passes through the thick cables of the battery toward cable terminals on which are received the fuses and pins of the power relays, which permits the use of cables of large cross section, dimensioned as a function of the current to be carried. The control pins of the relays are thus received on cable terminals soldered on a printed circuit in a conventional manner. The control electronics thus no longer need take account of high current intensity for its dimensioning. The current outlet is also by cable.

SUMMARY OF THE INVENTION

The present invention provides a new type of power relay module, which will be easier to use.

According to the invention, the power relay module comprises a thick support comprising means for receiving the pins of fuses, relays and a battery connection, internal lead ways suitable for the passage of currents of predetermined intensity, and a printed circuit board supporting the control electronics of the relays, said support facing the circuit board, and comprising at least two zones bearing on said card.

Preferably, the support also comprises terminals for receiving the control pins of the relays, these pins being connected by control leads to electrical wires soldered on the control circuit board.

According to a particular embodiment, the thick support also comprises means for electrical connection to the circuit board in at least one bearing zone.

It will be understood that this invention thus assembles in an advantageous manner the power current conduction elements, and control elements which do not require specific dimensioning. This arrangement thus promotes easy use of the power relay module. Moreover, the integration of the connection pins directly to the electronic card provides for economic production.

The description and drawing which follow permit better understanding the objects and advantages of the invention. It is clear that this description is given only by way of example, and is not limiting.

DESCRIPTION OF THE PREFERRED EMBODIMENTS

Figure 1:
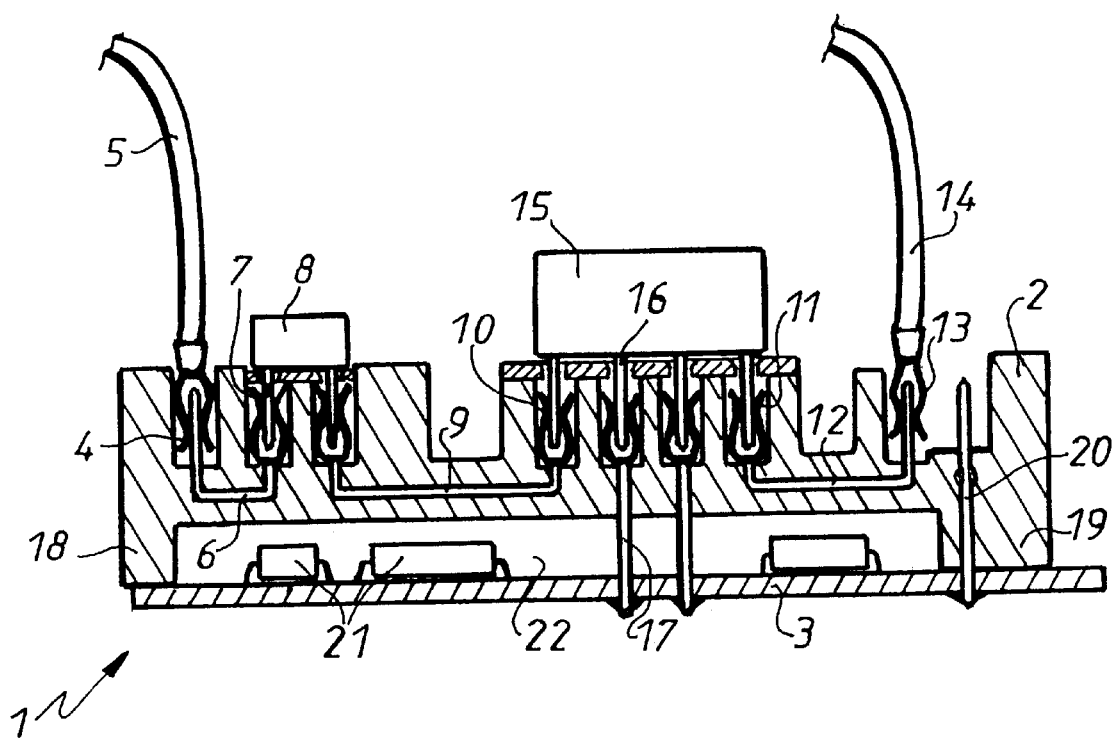
FIG. 1 is a side cross sectional view of a power relay module according to the invention.

As is seen in FIG. 1, which shows in a simplified manner a power relay module 1 according to the invention in use for an automobile computer, the module is comprised of a thick support 2 and a printed circuit board 3, supporting these components and disposed facing each other.

The support 2 comprises a terminal 4 for the connection with incoming power cable 5, for example from a battery. This inlet connection 4 is connected by a first conductive lead way 6 to terminal 7 that supports a fuse 8. A second lead way 9 connects this fuse 8 to a power inlet terminal 10 for a relay 15. Similarly, a power outlet terminal 11 connects, by means of a third conductive lead way 12, this relay 15 to an outlet terminal 13 adapted to receive within it an outlet power cable 14.

The support 2 moreover comprises connection terminals for the pins 16 for controlling the relay 15. These terminals are connected to substantially rectilinear electrical connectors 17 (vertical in FIG. 1), extending outside the support 2, so as to be able to be soldered to the surface of the circuit board 3.

The support 2 is a block, for example, made of a rigid plastic material by overmolding on conductive metallic lead ways, by processes known to those skilled in the art.

Finally, the support comprises, in line with the lateral projection 19, a through connector 20, which permits connection in the upper part by a conventional means such as a female terminal, and which at its lower part projects through a bearing zone on the circuit board 3, thereby permitting a soldering to said circuit board 3.

The support 2 is for example made of a rigid plastic material by overmolding on conductive metallic lead ways, by processes known to those skilled in the art.

The circuit board 3 is of the conventional type, known per se, and supports, in the present non-limiting example, components 21 forming an electronic control for the power relays of an automotive computer. It will be understood that the lateral projections 18, 19 define a space 22 above said printed circuit board 3 and below the support 2, sufficient to receive components 21 necessary for the control electronics, taking account of possible problems of ventilation of the components.

In the embodiment that has been described, the power current passes through the connections of the support 2 provided with receiving terminals and through suitable lead ways, without passing through the control circuit board 3. This avoids problems of overheating the solder. Moreover, the outlet takes place from the outlet terminal 13, integrated with the connector.

It will also be noted that the control functions of the relays are carried out by the electrical connector 17, which are soldered to the circuit board.

There has thus been provided a power relay module that is very compact, which integrates both the control electronics and the conductors for conducting power current, by separating the functions on the one hand of electrical power transfer, and, on the other hand, of control which uses very much weaker currents. The judicious combination of the overmolded support 2 and a circuit board 3 disposed facing the latter, therefore permits achieving advantages of economy and ease of use that the prior art arrangements did not permit.

Several modifications can be considered: as a first modification, the relays are fixed by reversible reception ("clipping" according to a term currently used by those skilled in the art) on a distribution (support) inserted in a plate forming a base. In a second modification, the distributor is overmolded and then fixed in the base plate. In another modification, the relays are soldered on overmolded distributors, then fixed in the base plate. Finally, in still another modification, the relays are soldered on distributors inserted in a plate forming a base.

The scope of the present invention is not limited to the details of the embodiments set forth above by way of example, but extends on the contrary to modifications within the scope of those skilled in the art.

What is claimed is:

1. A power relay module comprising:
   a single-piece support (2), the support being a solid block;
   reception means (4, 7, 10, 11) mounted to the support along an upper exterior surface of the support, the reception means for receiving fuse pins, relays and a battery connector;
   internal lead ways (6, 9, 12) directly and completely embedded into the support, connecting one of the reception means to another one of the reception means and suitable for the passage of currents of predetermined intensity from the one of the reception means to the another one of the reception means, the internal lead ways running horizontally through the support; and
   a circuit board supporting control electronics of the relays,
   said support (2) being disposed facing the circuit board and comprising, along a lower exterior surface, at least two zones bearing on said circuit board,
   the reception means being connected to the internal lead ways at the upper exterior surface of the support.

2. Module according to claim 1, characterized in that the support also comprises:
   terminals receiving relay control pins (16),
   plural of said terminals being connected to electrical leads soldered to the circuit board, and
   at least one of said terminals being connected to a large current power cable via one of the internal lead ways.

3. Module according to claim 2, characterized in that the support (2) also comprises means for electrical connection (20) to the circuit board in at least one bearing zone.

4. Module according to claim 1, characterized in that the support (2) also comprises means for electrical connection (20) to the circuit board in at least one bearing zone.

5. A power relay module, comprising:
   a support block having, in cross section, a perimeter defined by two sides, an upper exterior surface, and a lower exterior surface;
   a printed circuit board mounted to the lower exterior surface; and
   a cavity located between the support block and the printed circuit board,
   the support block having terminals located along the upper exterior surface, the terminals for receipt of incoming and outgoing power cables,
   the support block having plural internal lead ways passing and completely embedded through a solid horizontal portion of the support, each of the internal lead ways horizontally connecting together pairs of the terminals,
   each end of the lead ways connecting to one of the terminals at a lower surface of a cavity located along the upper exterior surface of the support.

6. The power relay module of claim 5, wherein the support block is, in cross section, H-shaped, there being lateral projections at the support sides and the horizontal portion connecting therebetween.

7. The power relay module of claim 6, wherein the lateral projections have coplanar bearing zones bearing against the printed circuit board.

8. A power relay module, comprising:
   a single-piece support having a horizontal portion joining ends in the form of lateral projections,
   an exterior perimeter of the support being defined by outside edges of the lateral projections and the horizontal portion, the support being solid within the exterior perimeter,
   the lateral projections having coplanar bearing zones on a lower exterior surface of the support,
   a printed circuit board mounted to the bearing zones;
   an enclosed cavity located between the support and the printed circuit board;
   internal lead ways passing horizontally through and completely embedded within the horizontal portion and to cavity regions located along an upper exterior surface of the support; and
   terminals located in the cavity regions and connected to the internal lead ways at lower surfaces of the cavity regions, the terminals adapted for connection to incoming and outgoing power cables, pairs of the terminals being connected together by the internal lead ways.

* * * * *